(12) United States Patent
Yun et al.

(10) Patent No.: US 7,498,263 B2
(45) Date of Patent: Mar. 3, 2009

(54) METHOD OF PLANARIZING AN INTER-METAL INSULATION FILM

(75) Inventors: Se-rah Yun, Suwon-si (KR); Chang-ki Hong, Suwon-si (KR); Jae-dong Lee, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 449 days.

(21) Appl. No.: 11/298,678

(22) Filed: Dec. 12, 2005

(65) Prior Publication Data

US 2006/0148258 A1 Jul. 6, 2006

(30) Foreign Application Priority Data

Jan. 4, 2005 (KR) .................. 10-2005-0000377

(51) Int. Cl.
*H01L 21/302* (2006.01)
*H01L 21/461* (2006.01)
(52) U.S. Cl. .............. 438/691; 438/691; 438/692; 257/E21.242

(58) Field of Classification Search ............. 438/690, 438/691, 692; 257/E21.242
See application file for complete search history.

(56) References Cited

U.S. PATENT DOCUMENTS

| 5,677,239 | A |   | 10/1997 | Isobe |
| 5,874,516 | A | * | 2/1999 | Burgoyne et al. ........... 528/219 |
| 6,169,039 | B1 | * | 1/2001 | Lin et al. .................... 438/761 |
| 6,828,226 | B1 | * | 12/2004 | Chen et al. .................. 438/626 |
| 6,969,684 | B1 | * | 11/2005 | Gilboa et al. ............... 438/704 |

FOREIGN PATENT DOCUMENTS

| JP | 07-045616 | 2/1995 |
| JP | 08-162431 | 6/1996 |
| KR | 1020020068672 | 8/2002 |

* cited by examiner

*Primary Examiner*—Asok K Sarkar
(74) *Attorney, Agent, or Firm*—Volentine & Whitt, PLLC

(57) ABSTRACT

A method for forming a planarized inter-metal insulation film is provided. The method includes applying a CMP process to an insulation film as controlled by a polish-stop layer pattern formed on an underlying metal wiring pattern. A PAE based material may be used to form the polish-stop layer.

18 Claims, 5 Drawing Sheets

METHOD OF PLANARIZING AN INTER-METAL INSULATION FILM

BACKGROUND OF THE INVENTION

1. Field of the Invention

Embodiments of the invention relate to a method for manufacturing semiconductor devices. More particularly, embodiments of the invention relate to a method for forming a planarized inter-metal insulation film on a metal wiring layer.

This application claims the benefit of Korean Patent Application No. 10-2005-0000377, filed on Jan. 4, 2005, the disclosure of which is hereby incorporated by reference in its entirety.

2. Description of the Related Art

The various manufacturing processes used to fabricate semiconductor devices include numerous individual processes. Some of the individual processes relate to photolithography, etching, thin film formation, diffusion, planarization, etc. As repeatedly applied in constructive combination to a semiconductor substrate, these processes ultimately form, amongst other potential structures, conductive patterns separated by insulation films.

The planarization of an upper surface of "resulting structure" formed by the layered combination of conductive patterns and insulation films during the overall manufacturing process fabricating a semiconductor device is a very important technical consideration. A properly planarized upper surface is necessary predicate to the accurate and convenient application of subsequent processes adapted to form additional elements, layers, etc. on the resulting structure. Therefore, careful consideration is given to the nature of the materials forming the upper surface of the resulting structure and the processes used to planarize it.

For example, conventional methods of surface planarization use a material having significant fluidity, such as borophosilicate glass (BPSG) or spin on glass (SOG). However, even in processes using these beneficial materials, it is difficult to obtain a completely planarized upper surface of the resulting structure. Thus, the conventional methods using highly fluid materials generally include an additional step of heating material to or near its melting point in order to reflow the material or remove solvent(s) contained in the material. Unfortunately, this additional thermal treatment process usually requires the application of high-temperatures which cause collateral problems, such as the short channel effect in active devices formed within the semiconductor device. This being the case, chemical mechanical polishing (CMP) methods are most contemporarily used to planarize the upper surface of semiconductor devices.

Against this processing state, contemporary semiconductor devices are becoming ever more highly integrated. Dense circuit and element integration necessitates the use of a plurality of metal wiring layers separated by inter-metal insulation films. The accurate and effective formation of this common combination of metal layers and inter-metal insulation films is also a very important consideration. This is particularly true for multi-layered metal wiring structure, where an increasing number of metal wiring layers and inter-metal insulation films are used.

FIGS. 1A and 1B are cross-sectional views illustrating one conventional method for planarizing an inter-metal insulation film.

Referring to FIG. 1A, a metal wiring layer 20 having a first thickness ($t_1$) is formed on a semiconductor substrate 10. (Semiconductor substrate 10 may include any reasonable number of stacked conductive patterns (not shown) or related inter-layer insulation films (not shown), but for the sake of clarity only a single combination of these elements are illustrated). An inter-metal insulation film 30 is formed on metal wiring layer 20. Inter-metal insulation film 30 is formed with a stepped, second thickness ($t_2$) irregularly formed on the first thickness ($t_1$) of metal wiring layer 20. At this point, it should be noted that within this written description, the term "on" is used to denote layers, elements, etc., formed directly on another layer element, etc., or on intervening layer(s), element(s), etc.

Referring to FIG. 1B, the removal of an upper portion of the irregularly formed (e.g., stepped) inter-metal insulation film 30 is accomplished using a conventional CMP process, whereby a planarized inter-metal insulation film 30a is formed. Planarized inter-metal insulation film 30a is formed to a third thickness ($t_3$) on metal wiring layer 20.

According to the foregoing conventional method, a significant quantity of material used to form inter-metal insulation film 30 must be removed in order to remove the entire upper portion of the stepped layer. In certain circumstances, the removal of this upper portion of the stepped inter-metal insulation film may result in planarization to an undesirable depth. Additionally, a CMP process sufficient to remove the significant quantity of insulating material is often overly time consuming. Further, the irregular upper surface of the inter-metal insulation layer to which the CMP process is applied makes it difficult to precisely align and remove a specific thickness of material forming the insulation film. Thus, the CMP process may result in a non-uniform upper surface that varies with semiconductor wafer positioning under the CMP process. Excellent planarization characteristics, therefore, cannot be obtained using the conventional methods.

FIG. 2 is a graph illustrating a thickness distribution for an inter-metal insulation film measured at a variety of positions on a wafer following planarization of the inter-metal insulation film using the conventional method illustrated in FIGS. 1A and 1B.

The data illustrated in FIG. 2 was obtained from samples comprising a metal wiring layer having the structure shown in FIG. 1A and formed to a thickness of about 12,000 Å on a semiconductor substrate. An oxidation film was formed as the inter-metal insulation film. The second thickness of the oxidation film formed on the metal wiring layer is about 32,000 Å and the stepped portion (e.g., the first thickness) of the oxidation film is about 12,000 Å. After the stepped portion of the oxidation film was removed using a conventional CMP process and assuming a target (third) thickness of the oxidation film on the metal wiring layer of about 9,000 Å. Thereafter, a number of measurements were made for the actual thickness of the oxidation film at a variety of positions on the wafer. As can bee seen from FIG. 2, the target (third) thickness of the inter-metal insulation film varied from about 1,500 to 2,000 Å.

In addition to the problems noted above, this test data is exemplary of unacceptable deviations in the actual thickness of the planarized inter-metal insulation layer obtained from use of the conventional methods. Such deviations are particularly apparent between insulation films formed on different wafers and on wafers contained in different processing lots.

SUMMARY OF THE INVENTION

Embodiments of the invention provide a method of forming a planarized inter-metal insulation film adapted for use in semiconductor device having better controlled thickness and excellent planarization characteristics with improved process throughput.

Thus, in one embodiment, the invention provides a method of forming a planarized inter-metal insulation film, comprising; forming a metal wiring pattern exposing portions of a semiconductor substrate, forming a polish-stop layer pattern on the metal wiring pattern, forming a first insulation film on the polish-stop layer pattern and the exposed portions of the semiconductor substrate, polishing the first insulation film using a chemical mechanical polishing (CMP) process until the polish-stop layer pattern is exposed to form a first inter-metal insulation film, removing the polish-stop layer pattern to expose the metal wiring pattern, and forming a second inter-metal insulation film from a second insulation film formed on the first inter-metal insulation film and the metal wiring pattern.

In another embodiment, the invention provides a method of forming a planarized inter-metal insulation film, comprising; forming a metal wiring pattern to exposes portions of a semiconductor substrate, covering an upper surface of the metal wiring pattern with a PAE (polyarylene ether) based material, forming a first insulation film on the exposed portions of the semiconductor substrate, performing a chemical mechanical polishing (CMP) process on the first insulation film until a surface of the PAE based material is exposed, to thereby form a planarized first insulation film, removing the PAE based material, and forming a second insulation film on the planarized first insulation film and the metal wiring pattern.

In yet another embodiment, the invention provides, a method of forming a planarized inter-metal insulation film, comprising; forming a metal layer on a semiconductor substrate, forming a polishing-stop layer on the metal layer, patterning the metal layer and polishing-stop layer to expose portions of the semiconductor substrate, form a metal wiring pattern, and form a polish-stop layer pattern, forming a first insulation film on the polish-stop layer pattern and the exposed portions of the semiconductor substrate, polishing the first insulation film using a chemical mechanical polishing (CMP) process until the polish-stop layer pattern is exposed to form a first inter-metal insulation film, removing the polish-stop layer pattern to expose the metal wiring pattern and, forming a second inter-metal insulation film from a second insulation film formed on the first inter-metal insulation film and the metal wiring pattern.

BRIEF DESCRIPTION OF THE DRAWINGS

Embodiments of the invention will be described hereafter with reference to the attached drawings. In the drawings, the thicknesses of layers and regions may have been exaggerated for clarity. In the drawings.

DESCRIPTION OF EXEMPLARY EMBODIMENTS

Embodiments of the invention will now be described in some additional detail with reference to the accompanying drawings. However, many other embodiments, as well as modifications and alterations to the illustrated embodiments, are possible beyond the teaching examples presented here. Thus, the scope of the invention should not be construed as being limited to only the exemplary embodiments set forth herein.

FIGS. 3A through 3F are cross-sectional views illustrating an exemplary method of forming a planarized, inter-metal insulation film in a semiconductor device according to one embodiment of the invention.

Figure 1A:
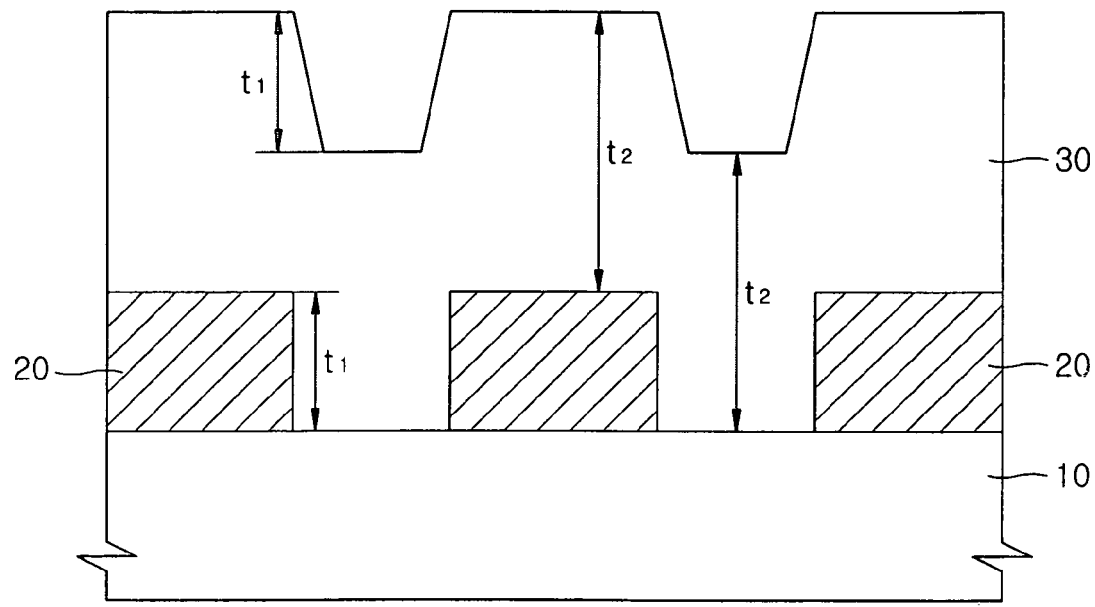
FIGS. 1A and 1B are cross-sectional views illustrating a conventional method for forming a planarized, inter-metal insulation film.
Figure 1B:
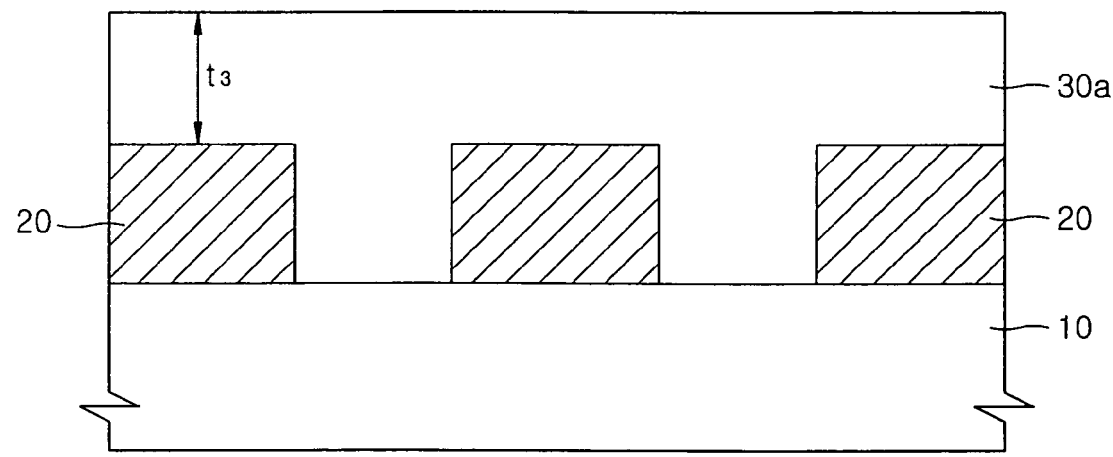
Figure 2:
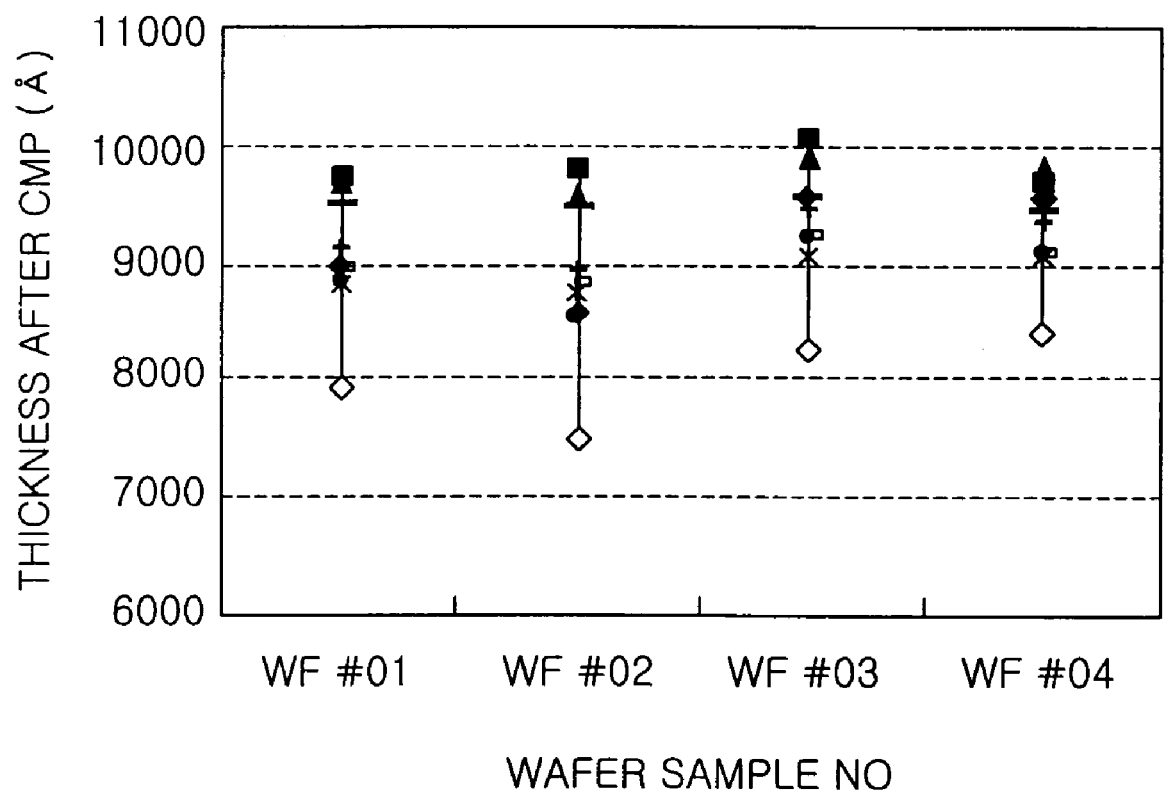
FIG. 2 is a graph illustrating a thickness distribution of the inter-metal insulation film measured at a variety of positions of a wafer as formed by a conventional method.
Figure 3A:
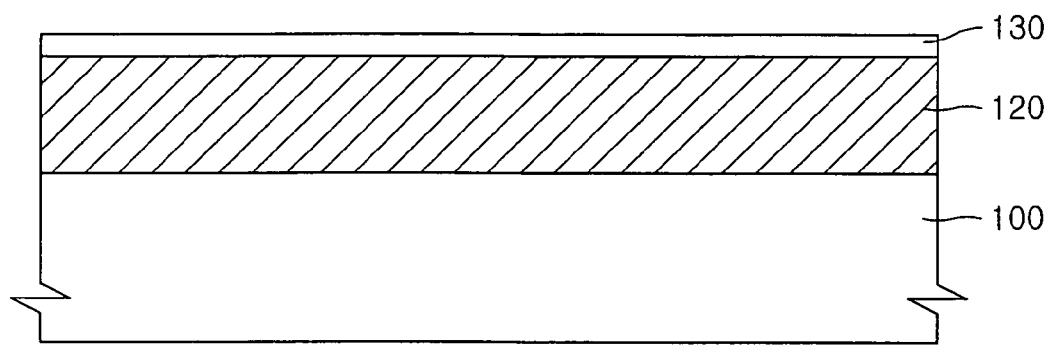
FIGS. 3A through 3F are cross-sectional views illustrating an exemplary method of forming a planarized, inter-metal insulation film in a semiconductor device according to one embodiment of the invention.

Referring to FIG. 3A, a metal layer 120 formed from, for example, aluminum, tungsten, copper, or an alloy of same, is formed on semiconductor substrate 100 to a predetermined first thickness. As noted above, an inter-layer insulation film (not shown) covering sub-structures formed on semiconductor substrate 10 might be interposed between these two layers, but for clarity of explanation illustration of such potentially interposing layers and sub-structures have been omitted from this description. Exemplary sub-structures include, as examples, gate electrodes, bit lines, capacitor electrodes, etc.

A polish-stop layer 130 is then formed on (e.g., covering an upper surface of) metal layer 120 to a second thickness. Polish-stop layer 130 may be formed from one or more materials selected from a group consisting of PAE based material, $Si_3N_4$, SiON, Ti, TiN, Ta, and TaN. The PAE based material referenced above may be represented by the following chemical formula,

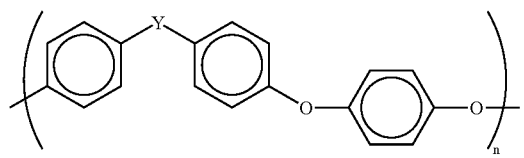

where, Y represents O, S, CO, or $SO_2$, and n is an integer representing the number of repetition. For example, "FLARE", a PAE based material produced for Advanced Microelectronic Materials by AlliedSignal Inc., or SILK, a PAE based material produced by Dow Chemical Co. might be used. Of note, PAE based materials typically have a low dielectric constant (low-k) ranging from about 2.6 to 2.8. Further, since PAE based materials show stable characteristics for temperatures under about 450° C., they may be very advantageously used to provide thermal stability to polish-stop layer 130.

Polish-stop layer 130 may be made from a material such that an etch selectivity ratio between polish-stop layer 130 and the insulation film is about more than 1:10 for a CMP process using a predetermined slurry. For example, the etch selectivity of the insulation film to the PAE based material is large for CMP processes using a silica slurry, thus an oxidation film can be selectively and effectively removed using the PAE based material as polish-stop layer 130. That is, a PAE based material may be used as an excellent polish-stop layer for CMP processes using a silica slurry.

Figure 3B:
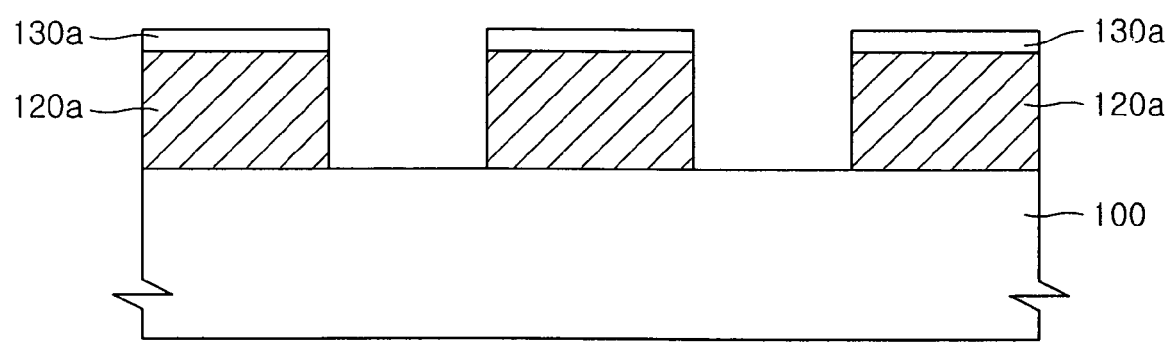

Referring to FIG. 3B, polish-stop layer 130 and metal layer 120 are patterned using, for example, conventional photolithography techniques such that portions of semiconductor substrate 100 are selectively exposed, and such that a metal wiring pattern 120a is formed with covering portions of a polish-stop layer pattern 130a on semiconductor substrate 100.

Figure 3C:
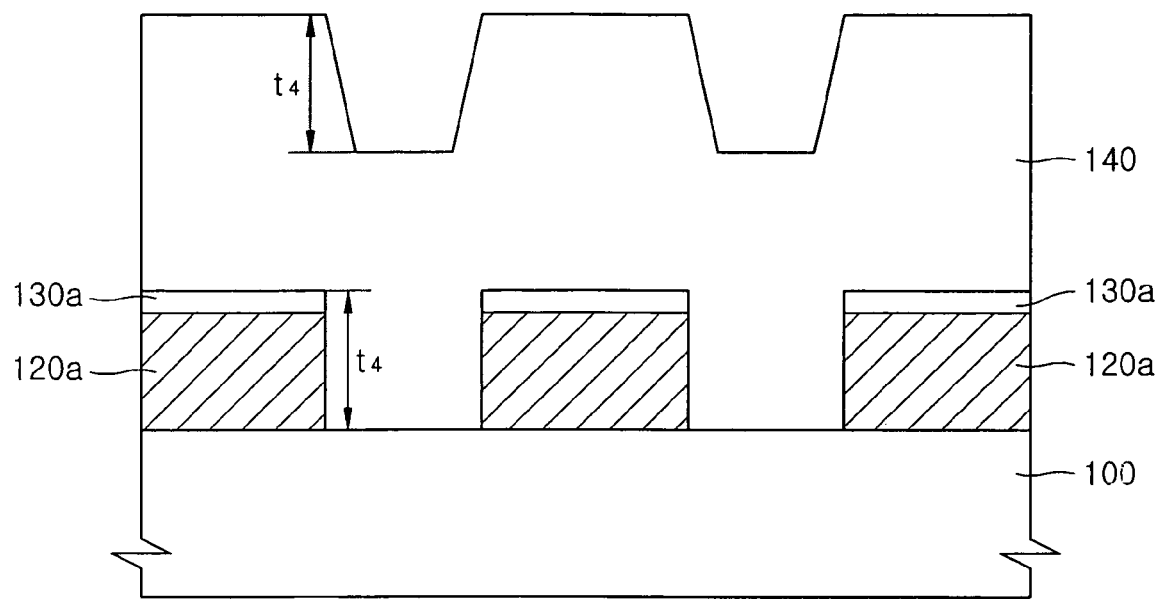

Referring to FIG. 3C, a first insulation film 140 is formed on the resulting structure including polish-stop layer pattern 130a and the exposed semiconductor substrate portions. First insulation film 140 may be formed from a material having a significant fluidity, and thus having excellent coverage characteristics such that gaps formed between segments of metal wiring pattern 120a are filled. For example, first insulation film 140 may be formed from flowable oxide (FOX), hydrosilsesquioxane (HSQ), or a spin on glass (SOG) based material such as TOSZ.

As noted above, where a PAE based material is used for polish-stop layer pattern 130a, excellent thermal stability for temperatures up to 450° C. may be obtained. Thus, first insulation film 140 may be readily deposited at temperatures ranging from room temperature up to 450° C.

As shown in FIG. 3C, first insulation film 140 is formed with an irregular (e.g.,) stepped upper surface, with individual steps extending upward by a third thickness ($t_4$) formed by the combined thicknesses of metal wiring pattern 120a (i.e., the first thickness) and polish-stop layer patterns 130a (i.e., the second thickness) on a surface of first insulation film 140.

Figure 3D:
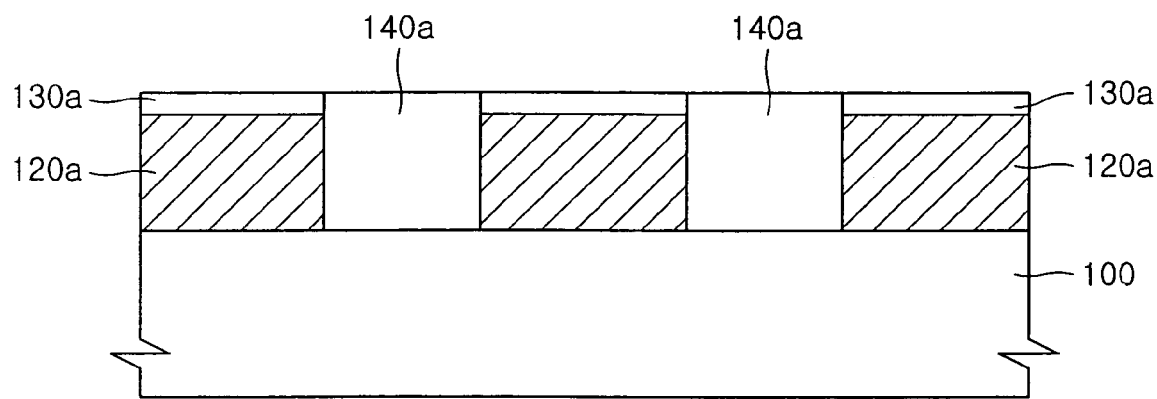
Figure 3E:
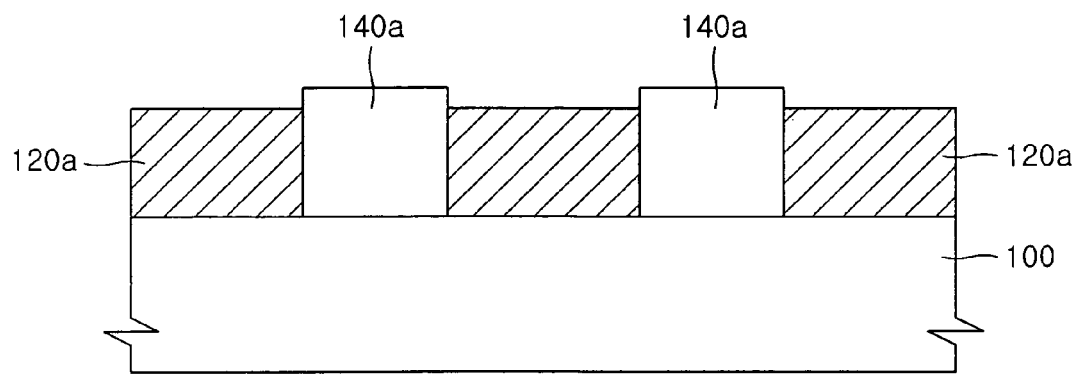

Referring to FIG. 3D, first insulation film 140 is then polished using a CMP process until the upper surface of polish-stop layer 130a is completely exposed, such that a first inter-metal insulation film 140a comprises portions of the first insulation film 140 filling regions between portions of metal wiring pattern 120a. Exemplary CMP processes adapted to the polishing of first insulation film 140 include those having slurries with polishing particles formed from at least one material selected from a group consisting of silica, ceria, zirconia, and $ZnO_2$. In one embodiment, a slurry comprising ceria polishing particles and/or silica polishing particles may be used.

Referring to FIG. 3 E, polish-stop layer patterns 130a is removed to expose the upper surface of metal wiring pattern 120a. To remove polish-stop layer pattern 130a, a selective dry etching process, a wet etching process, or an ashing and stripping process may be used. In case where polish-stop layer pattern 130a is formed from a PAF based material, polish-stop layer pattern 130a may be removed, for example, using an ashing and stripping process.

Figure 3F:
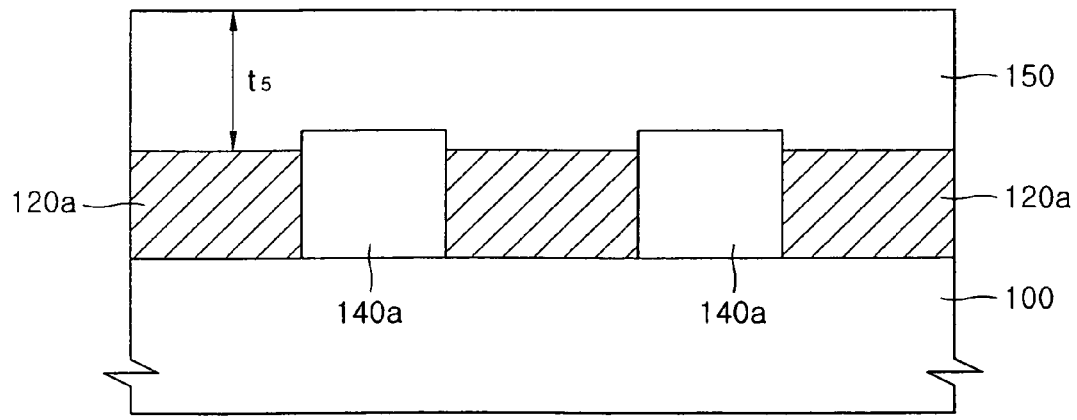

Referring to FIG. 3F, another insulation film, including in some embodiments a capping oxide, is then deposited on first inter-metal insulation film 140a and metal wiring pattern 120a, in order to form a second inter-metal insulation film 150. An insulation film forming second inter-metal insulation film 150 may be formed from at least one material selected from the group consisting of plasma-enhanced tetraethylorthosilicate (PE-TEOS), FOX, and SOG. The upper surface of second inter-metal insulation film 150 may be formed with a well planarized surface.

Once formed, second inter-metal insulation film 150 may be patterned using conventional techniques to form, for example, a contact via exposing metal wiring pattern 120a. In this context, embodiments of the invention provide the advantage of securing process margin when performing via hole etching.

In one aspect, the exemplary method described above makes use of the polish-stop layer during the CMP process subsequently applied to the insulation film so as to precisely define and control an etching stop point. Using this approach, an accurate and uniform target thickness (i.e., a fourth thickness $t_5$) for second inter-metal insulation film 150 may be achieved. This target thickness varies minimally with position on the wafer being processed. The foregoing approach also allows a thinner first insulting layer to be formed over metal layer pattern 120a. Reduced thickness in this inter-process layer reduces polishing time and improve process throughput accordingly. It is also possible to minimize deviations in the thickness of the inter-metal insulation films between lots and between wafers by precisely controlling the CMP target in a repeatable manner.

While exemplary embodiments of the invention have been described above, those of ordinary skill in the art will understand that various changes in form and details may be made to these embodiments without departing from the scope of the invention which is defined by the following claims.

What is claimed is:

1. A method of forming a planarized inter-metal insulation film, comprising:
   forming a metal wiring pattern exposing portions of a semiconductor substrate;
   forming a polish-stop layer pattern on the metal wiring pattern;
   forming a first insulation film on the polish-stop layer pattern and the exposed portions of the semiconductor substrate;
   polishing the first insulation film using a chemical mechanical polishing (CMP) process until the polish-stop layer pattern is exposed to form a first inter-metal insulation film;
   selectively removing the polish-stop layer pattern from between portion of the first inter-metal insulation film to expose upper surface portions of the metal wiring pattern, such that the exposed upper portions of the metal wiring pattern are stepped down from upper surface portions of the first inter-metal insulation film; and thereafter,
   forming a second inter-metal insulation film from a second insulation film formed on the upper surface portions of the first inter-metal insulation film and the upper surface portions of the metal wiring pattern.

2. The method of claim 1, wherein the polish-stop layer pattern is formed from at least one material selected from a group consisting of a PAE (polyarylene ether) based material, $Si_3N_4$, SiON, Ti, TiN, Ta, and TaN.

3. The method of claim 1, wherein the polish-stop layer pattern is formed from a PAE (polyarylene ether) based material represented by the chemical formula:

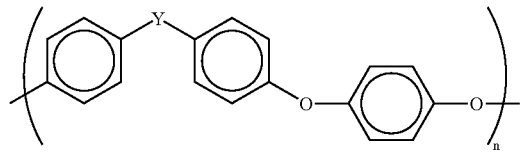

where, Y represents O, S, CO, or $SO_2$, and n is an integer representing the number of repetition.

4. The method of claim 1, wherein the first insulation film is formed at a temperature ranging from about room temperature to 450° C.

5. The method of claim 1, wherein the first insulation film is formed from a material comprising at least one material selected from a group consisting of FOX (flowable oxide), HSQ (hydrosilsesquioxane), and SOG (spin on glass).

6. The method of claim 1, wherein the CMP process uses a slurry including polishing particles formed from at least one material selected from a group consisting of silica, ceria, zirconia, and $ZnO_2$.

7. The method of claim 1, wherein the polish-stop layer pattern is formed from a PAE (polyarylene ether) based material, the first insulation film comprises an oxidation film, and the CMP process uses a ceria slurry or a silica slurry.

8. The method of claim 1, wherein removing of the polish-stop layer pattern comprises performing an ashing and stripping process.

9. The method of claim 1, wherein the second insulation film is formed from at least one material selected from a group consisting of PE-TEOS (plasma-enhanced tetraethylorthosilicate), FOX (flowable oxide), and SOG (spin on glass).

10. A method of forming a planarized inter-metal insulation film, comprising:
    forming a metal wiring pattern to expose portions of a semiconductor substrate;
    covering upper surface portions of the metal wiring pattern with a PAE (polyarylene ether) based material;
    forming a first insulation film on the exposed portions of the semiconductor substrate;
    performing a chemical mechanical polishing (CMP) process on the first insulation film until upper surface portions of the PAE based material are exposed, to thereby form a planarized first inter-metal insulation film;
    selectively removing the PAE based material from between portions of the first inter-metal insulation film to expose upper surface portions of the metal wiring pattern, such that the exposed upper surface portions of the metal wiring pattern are stepped down from upper surface portions of the first inter-metal insulation film; and thereafter,
    forming a second insulation film on the upper surface portions of the first inter-metal insulation film and the upper surface portions of the metal wiring pattern.

11. The method of claim 10, wherein the PAE based material layer is represented by the chemical formula:

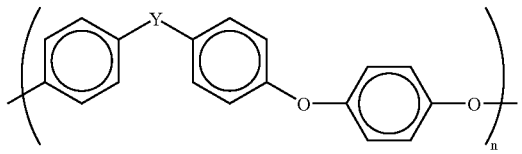

where, Y represents O, S, CO, or $SO_2$, and n is an integer representing the number of repetition.

12. The method of claim 10, wherein the first insulation film is formed at a temperature ranging from about room temperature to 450° C.

13. The method of claim 10, wherein the first insulation film is formed from at least one material selected from a group consisting of FOX (flowable oxide), HSQ (hydrosilsesquioxane), and SOG (spin on glass).

14. The method of claim 10, wherein the CMP process using a slurry comprising ceria polishing particles or silica polishing particles.

15. The method of claim 10, wherein removing of the PAE based material comprises performing an ashing and stripping process.

16. The method of claim 10, wherein the second insulation film is formed from at least one material selected from a group consisting of PE-TEOS (plasma-enhanced tetraethylorthosilicate), FOX (flowable oxide), and SOG (spin on glass).

17. A method of forming a planarized inter-metal insulation film, comprising:
    forming a metal layer on a semiconductor substrate;
    forming a polishing-stop layer on the metal layer;
    patterning the metal layer and polishing-stop layer to expose portions of the semiconductor substrate, form a metal wiring pattern, and form a polish-stop layer pattern on the metal wiring pattern;
    forming a first insulation film on the polish-stop layer pattern and the exposed portions of the semiconductor substrate;
    polishing the first insulation film using a chemical mechanical polishing (CMP) process until the polish-stop layer pattern is exposed to form a first inter-metal insulation film;
    selectively removing the polish-stop layer pattern from between portions of the first inter-metal insulation film to expose upper surface portions of the metal wiring pattern, such that the exposed upper portions of the metal wiring pattern are stepped down from upper surface portions of the first inter-metal insulation film; and thereafter,
    forming a second inter-metal insulation film from a second insulation film formed on the upper surface portions of the first inter-metal insulation film and the upper surface portions of the metal wiring pattern.

18. The method of claim 17, wherein the polish-stop layer pattern is formed from at least one a material selected from a group consisting of a PAE (polyarylene ether) based material, $Si_3N_4$, SiON, Ti, TiN, Ta, and TaN.

* * * * *